United States Patent
Abou-Khalil et al.

(10) Patent No.: US 10,037,895 B2
(45) Date of Patent: Jul. 31, 2018

(54) STRUCTURES, METHODS AND APPLICATIONS FOR ELECTRICAL PULSE ANNEAL PROCESSES

(71) Applicant: INTERNATIONAL BUSINESS MACHINES CORPORATION, Armonk, NY (US)

(72) Inventors: Michel J. Abou-Khalil, Essex Junction, VT (US); Robert J. Gauthier, Jr., Hinesburg, VT (US); Tom C. Lee, Essex Junction, VT (US); Junjun Li, Cupertino, CA (US); Souvick Mitra, Essex Junction, VT (US); Christopher S. Putnam, Hinesburg, VT (US); Robert R. Robison, Colchester, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/882,548

(22) Filed: Oct. 14, 2015

(65) Prior Publication Data

US 2016/0035716 A1 Feb. 4, 2016

Related U.S. Application Data

(62) Division of application No. 14/154,273, filed on Jan. 14, 2014, now Pat. No. 9,881,810, which is a division
(Continued)

(51) Int. Cl.
*H01L 23/62* (2006.01)
*H01L 21/324* (2006.01)
(Continued)

(52) U.S. Cl.
CPC ........ *H01L 21/324* (2013.01); *H01L 27/0255* (2013.01); *H01L 29/866* (2013.01); *H01L 29/8611* (2013.01)

(58) Field of Classification Search
CPC ............... H01L 21/324; H01L 27/0255; H01L 29/8611; H01L 29/866
See application file for complete search history.

(56) References Cited

U.S. PATENT DOCUMENTS 6,169,321 B1  6/2001  Nguyen et al.
6,256,184 B1  7/2001  Gauthier et al.
(Continued)

FOREIGN PATENT DOCUMENTS

JP       7297293 A       11/1995

OTHER PUBLICATIONS

Office Action from U.S. Appl. No. 14/154,273 dated Feb. 16, 2016. 12 pages.
(Continued)

*Primary Examiner* — Meiya Li
(74) *Attorney, Agent, or Firm* — Steven J. Meyers; Andrew M. Calderon; Roberts Mlotkowski Safran Cole & Calderon, P.C.

(57) ABSTRACT

Structures and methods are provided for nanosecond electrical pulse anneal processes. The method of forming an electrostatic discharge (ESD) N+/P+ structure includes forming an N+ diffusion on a substrate and a P+ diffusion on the substrate. The P+ diffusion is in electrical contact with the N+ diffusion. The method further includes forming a device between the N+ diffusion and the P+ diffusion. A method of annealing a structure or material includes applying an electrical pulse across an electrostatic discharge (ESD) N+/P+ structure for a plurality of nanoseconds.

17 Claims, 5 Drawing Sheets

Related U.S. Application Data of application No. 12/553,523, filed on Sep. 3, 2009, now Pat. No. 8,686,508.

(51) Int. Cl.
*H01L 27/02* (2006.01)
*H01L 29/866* (2006.01)
*H01L 29/861* (2006.01)

(56) References Cited

U.S. PATENT DOCUMENTS

| | | | |
|---|---|---|---|
| 6,274,909 B1 | 8/2001 | Chang et al. | |
| 6,294,412 B1 | 9/2001 | Krivokapic | |
| 6,649,499 B2 | 11/2003 | Mills, Jr. | |
| 6,913,954 B2 | 7/2005 | Kothandaraman | |
| 7,179,691 B1 * | 2/2007 | Lee | H01L 27/0255 438/135 |
| 7,261,461 B2 | 8/2007 | Grudin et al. | |
| 8,686,508 B2 * | 4/2014 | Abou-Khalil | H01L 21/324 257/127 |
| 2002/0084490 A1 * | 7/2002 | Ker | H01L 27/0255 257/355 |
| 2007/0133137 A1 | 6/2007 | Dornbusch | |
| 2008/0203534 A1 * | 8/2008 | Xu | H01L 27/0259 257/577 |
| 2009/0001472 A1 | 1/2009 | Salman et al. | |
| 2009/0121157 A1 | 5/2009 | Moffatt et al. | |

OTHER PUBLICATIONS

Office Action from U.S. Appl. No. 14/154,273 dated Mar. 24, 2017; 20 pages.
Greason et al., "Experimental Determination of ESD Latent Phenomena in CMOS Integrated Circuits", IEEE Transactions of Industry Applications, vol. 28, No. 4, 1992, pp. 755-760.
Office Action from U.S. Appl. No. 14/882,549 dated Sep. 12, 2017. 13 pages.
Notice of Allowance from U.S. Appl. No. 14/154,273 dated Sep. 13; 8 pages.
Office Action from U.S. Appl. No. 14/882,549 dated Mar. 27, 2018. 14 pages.

* cited by examiner

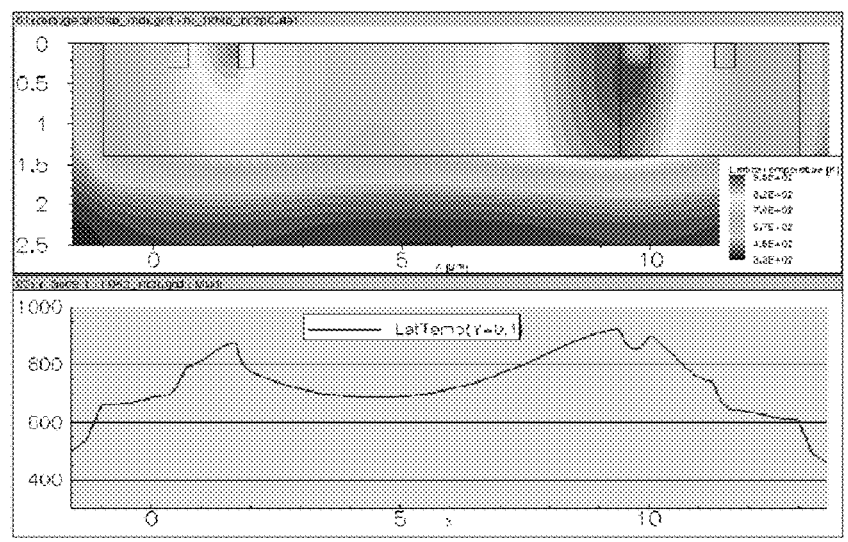
FIG. 3a
FIG. 3b
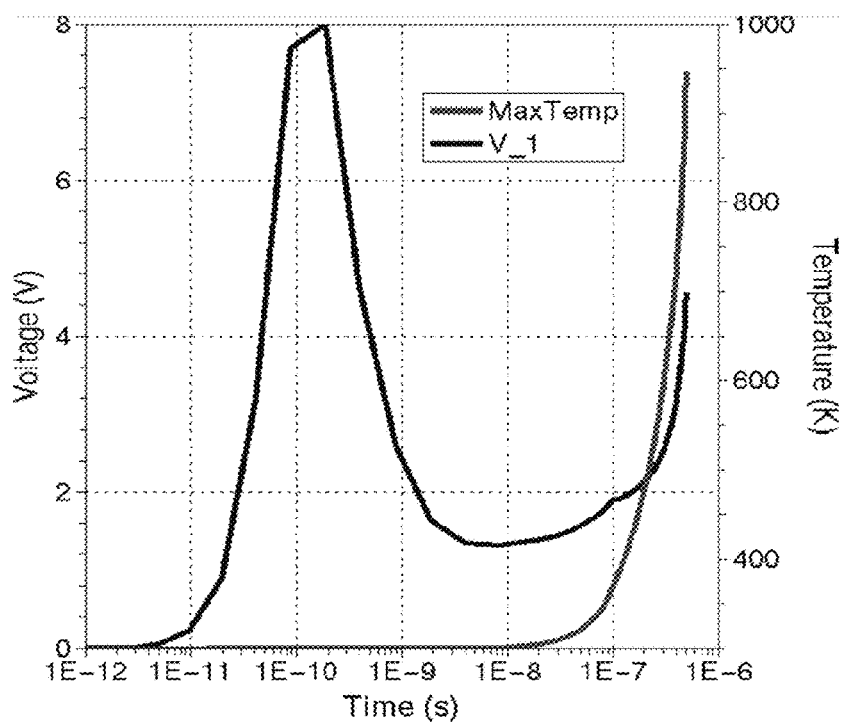
FIG. 4

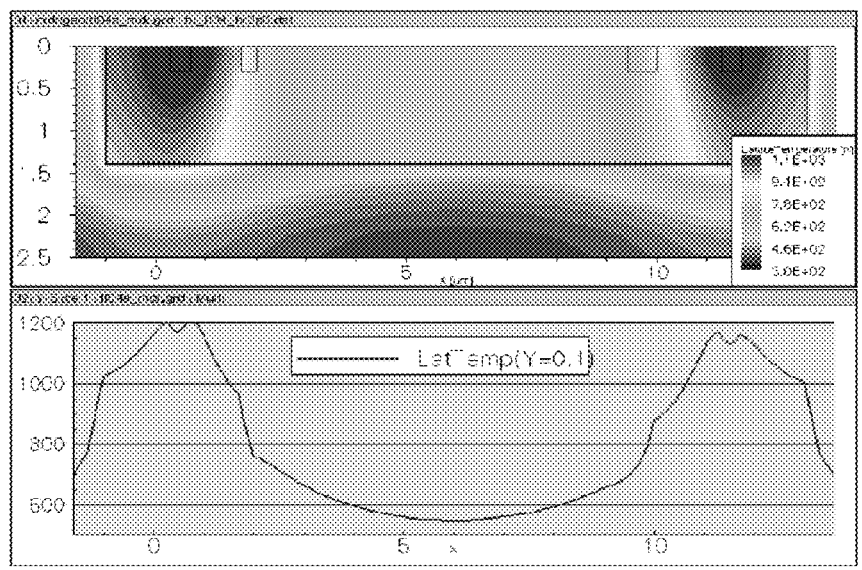
FIG. 7a
FIG. 7b
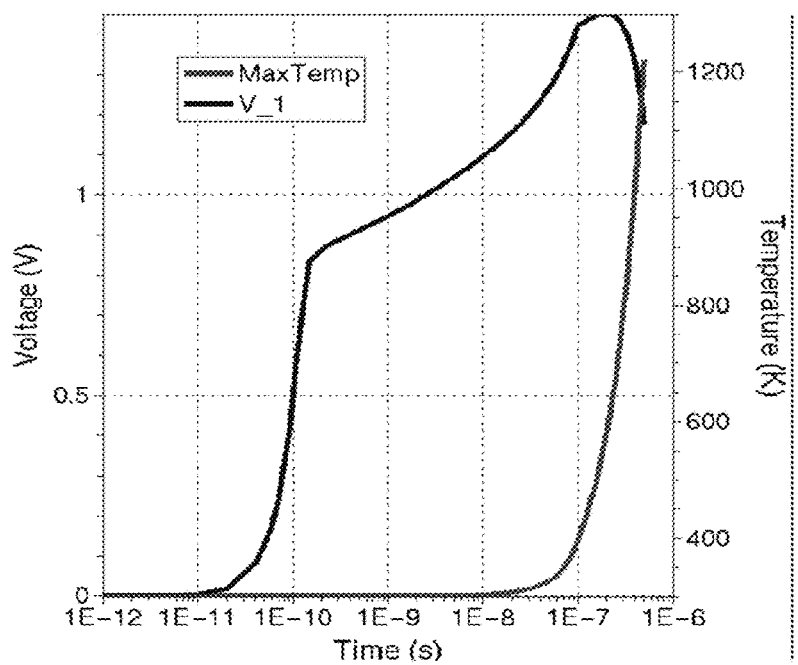
FIG. 8

STRUCTURES, METHODS AND APPLICATIONS FOR ELECTRICAL PULSE ANNEAL PROCESSES

CROSS-REFERENCE TO RELATED APPLICATIONS

This application is a Divisional of application Ser. No. 14/154,273, which is a Divisional of application Ser. No. 12/553,523, now U.S. Pat. No. 8,686,508.

FIELD OF THE INVENTION

The invention relates to structures and methods for electrical pulse anneal processes and, more particularly, to structures and methods for nanosecond electrical pulse anneal processes.

BACKGROUND

An annealing process is a heat treatment of a wafer in order to modify properties of materials/structures processed on its surface or in the bulk. For example, annealing is performed on the wafer in order to activate certain species (dopants) of a device such as, for example, associated with a transistor. Depending on the structures or dopants to be annealed, the temperatures necessary for such annealing process can range upwards of 1000° K in some applications and much lower temperatures in other applications.

Annealing can be performed by many different processes. For example, a rapid thermal annealing (RTA) of a wafer can be performed in an oven at high temperatures. In such applications, the entire structure and all materials on the surface are subject to an anneal at the same temperature. However, the anneal temperature for one device or structure may not be applicable for another device or structure, resulting in damage to some devices or structures. This process also has a large temperature ramp up time which increases processing times and costs.

Another annealing process is a laser anneal. In this process, for example, an excimer laser is used to anneal structures/materials on the wafer. This annealing process has a large temperature ramp up time and duration and a non-uniform temperature distribution, which causes limitations for species activation/device performance. For example, the laser has a large beam resolution on the order of about 500 μm² which makes it impractical for use with smaller areas requiring an anneal. As such, using a laser annealing process may damage structures close to the anneal. Also, as the beam is known to diverge due to reflection, it is possible to cause a non-uniform anneal.

In yet another annealing process, it is possible to place a resistor on a back end of line (BEOL) device in order to anneal a front end of line (FEOL) device. In such applications, though, it is difficult to control the heating and, as a result, it is possible to damage the FEOL device during the annealing process. Typically, such annealing method is only good for large FEOL devices.

Accordingly, there exists a need in the art to overcome the deficiencies and limitations described hereinabove.

SUMMARY

In a first aspect of the invention, a method of forming an electrostatic discharge (ESD) N+/P+ structure comprises forming an N+ diffusion on a substrate and a P+ diffusion on the substrate. The P+ diffusion is in electrical contact with the N+ diffusion. The method further comprises forming a device between the N+ diffusion and the P+ diffusion.

In another aspect of the invention, a method of annealing a structure or material comprises applying an electrical pulse across an electrostatic discharge (ESD) N+/P+ structure for a plurality of nanoseconds.

In yet another aspect of the invention, an electrostatic discharge (ESD) N+/P+ structure comprises an N+ diffusion on a substrate and a P+ diffusion on the substrate which is in electrical contact with the N+ diffusion. The structure further includes a device between the N+ diffusion and the P+ diffusion.

In another aspect of the invention, there is a design structure tangibly embodied in a machine readable medium used for designing, manufacturing, or testing an integrated circuit. The design structure includes the method steps and/or structure of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 3a and 3b show a temperature profile and related temperature graph for the structure of FIG. 1;

FIG. 4 shows a voltage vs. temperature transient simulation graph for the structure of FIG. 1;

FIGS. 7a and 7b show a temperature profile and related temperature graph for the structure of FIG. 5;

FIG. 8 shows a voltage vs. temperature transient simulation graph for the structure of FIG. 5.

DETAILED DESCRIPTION

The invention relates to structures and methods for electrical pulse anneal processes and, more particularly, to structures and methods for nanosecond electrical pulse anneal processes. In embodiments, the present invention includes, for example, an electric static discharge (ESD) device which is capable of generating heat for annealing processes. Advantageously, upon the application of an electric pulse, the ESD device can generate localized heat (e.g., about 500° K 500° K to 1200° K 1200° K) to a particular feature of a device for annealing processes. In embodiments, the heat is uniform and can be generated at a small, localized area of about 50 to 100 μm². In this way, advantageously, the present invention provides structures and methods that can focus heat on a localized area for annealing processes, without damaging surrounding structures. The devices that can benefit from the present invention include all active and passive devices in FEOL, BEOL and the substrate, for example.

Figure 1:
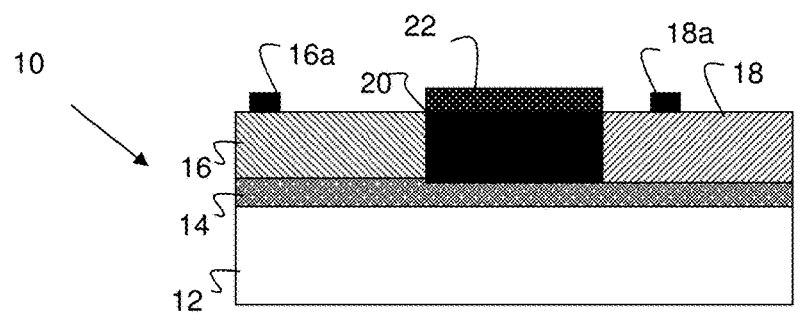
FIG. 1 shows a cross sectional view of a structure in accordance with aspects of the invention.

FIG. 1 shows a structure in accordance with an aspect of the invention. More particularly, the structure 10 is an ESD body diode structure. In embodiments, the structure 10 includes, for example, a BOX (buried oxide) layer 14 formed on a substrate 12. An N+ diffusion 16 and a P+ diffusion 18 are formed in the BOX layer 14 using conventional processes and dopants such that no further explanation is required herein for an understanding of the invention. After the implantation process, the structure can undergo a well stabilization process, e.g., an anneal at about 500° K to 600° K. In the structure of FIG. 1, the N+ diffusion 16 will act as a cathode and the P+ diffusion 18 will act as an anode. In embodiments, the ESD diode will be formed between the N+ diffusion 16 and the P+ diffusion.

In embodiments, contacts 16a and 18a are formed in electrical contact with the N+ diffusion 16 and P+ diffusion 18, respectively. The contacts 16a and 18a can be formed, for example, using a conventional in-sitsu doped poly deposition process. As should be understood, the contacts 16a and 18a are used for supplying an electrical pulse to generate heat across an active region. More specifically, the contact 18a will allow an electric pulse to flow through the anode (P+ diffusion 18) of the structure 10; whereas, the contact 16a will allow the electric pulse to flow out of the cathode (N+ diffusion 16). In an optional step, a metal deposition process (removable) can be performed on the structure.

Still referring to FIG. 1, a front end of the line (FEOL) active or passive device 20 is formed in electrical contact with the N+ diffusion 16 and P+ diffusion 18, respectively. The active or passive device 20 can be formed using any conventional process for the particular device. In embodiments, the device 20 can be any desired device such as, for example, a small circuit for a phase-locked loop or phase lock loop (PLL), a ring oscillator or voltage controlled oscillator (VCO), etc. An optional block 22 may be formed on the device 20 using a conventional blocking process such as, for example, a CVD (chemical vapor deposition) process. As should now be understood by those of skill in the art, the N+ diffusion 16, active device 20 and the P+ diffusion 18 form an ESD N+/P+ body diode structure.

Figure 2:
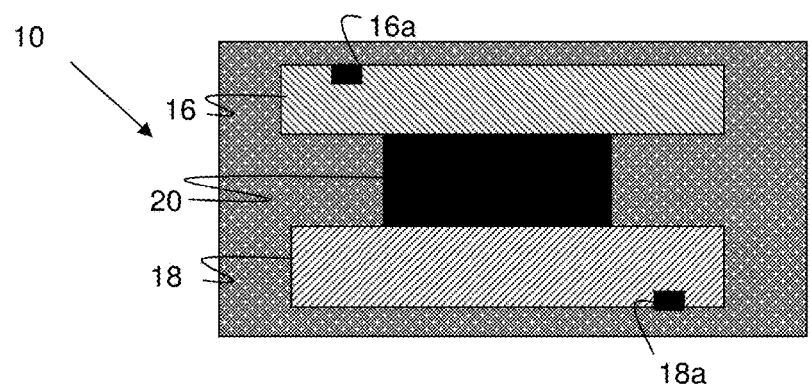
FIG. 2 shows a top view of the structure of FIG. 1.

FIG. 2 shows a top view of the ESD body diode structure 10 of FIG. 1. In embodiments, the active area 20 (e.g., active or passive device 20) is positioned between the N+ diffusion 16 and the P+ diffusion 18. Also, in embodiments, the active area is about 50 to 100 µm$^2$; however, other dimensions are also contemplated by the present invention (e.g., including larger than about 50 to 100 µm$^2$). The active area 20 is in electrical contact with the N+ diffusion 16 and the P+ diffusion 18, thereby forming the ESD N+/P+ body diode structure 10.

In operation, an electrical pulse is applied to the contact 18a of the structure which, in turn, will very quickly produce heat across the ESD N+/P+ body diode structure 10. More particularly, an electrical pulse of about 100 ns to about 500 ns can be applied across the ESD N+/P+ body diode structure 10 in order to generate a localized heat on the order of about, for example, 500° K to about 1200° K, depending on the area of the active area 20 and the duration of the electrical pulse. In embodiments, the electrical pulse is capable of generating a uniform, localized heat to a very precise location, e.g., within an area of 50 to 100 µm$^2$. The localized heat will anneal a very small area, e.g. a doped region to activate dopants, which would not otherwise be possible with laser anneal or back end of line (BEOL) devices. Also, as the heat is very localized, other regions of the substrate will not be exposed to more than a maximum allowable temperature (e.g., a temperature lower than the annealing temperature) during the entire processing of the wafer, thus ensuring that no damage will be sustained to other devices or regions of the device.

FIG. 3a shows a two-dimensional temperature profile and FIG. 3b shows a one dimensional temperature graph of the structure shown in FIG. 1. As shown in FIG. 3b, the "y" axis is temperature, in degrees Kelvin, and the "x" axis is distance across the device as measured in microns (e.g., in the "y" direction). As noted in the corresponding graphs, at a duration of about 100 nanoseconds (with a rise and fall time of about 7 nanoseconds), an electrical pulse of about 250 milliamps can apply a peak temperature of about 950° K for a 10 micron by 10 micron structure. The graphs further show a uniform, local temperature of about 700° K across a "y" cross section of the active area (e.g., about 8 to 10 microns). Accordingly, it is shown that an electrical pulse is capable of generating a uniform, localized heat to a very precise location, e.g., within an area of 50 to 100 µm$^2$, while not damaging other regions of the device.

In further examples, a 25 milliamps electrical pulse can be applied to a 100 micron by 10 micron device. Also, in still a further example, 2.5 milliamps electrical pulse can be applied to a 100 micron by 100 micron device. Further examples are also contemplated by the present invention, depending on the particular area of the device. The present invention can also be applied for FEOL or BEOL structures. In any of these illustrative examples, the electrical pulse can have a duration of about 100 ns to about 500 ns, and results in a uniform, localized anneal.

FIG. 4 shows a voltage vs. temperature transient simulation graph for the structure of FIG. 1. As shown in FIG. 4, the temperature rise, upon an application of an electrical pulse, is very fast. Also, as shown in the peak of the voltage line, voltage is very contained and, as such, will not cause any damage to other structures (devices) on the wafer.

Figure 5:
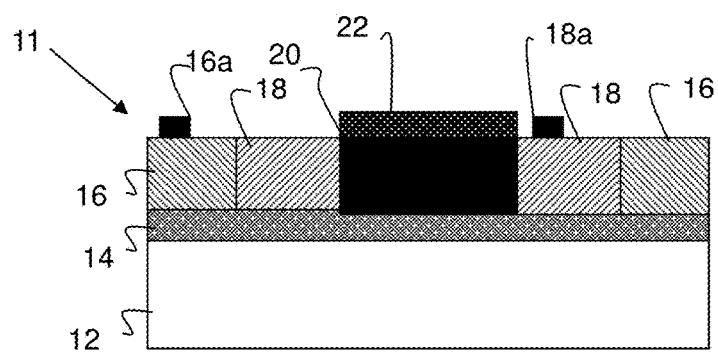
FIG. 5 shows a cross sectional view of a ring structure in accordance with aspects of the invention.
Figure 6:
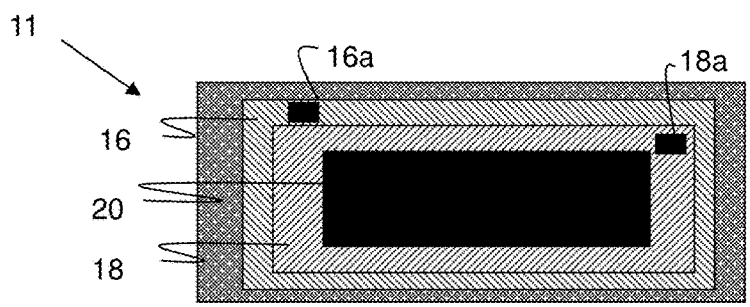
FIG. 6 shows a top view of the ring structure of FIG. 5.

FIG. 5 shows a cross sectional view of a ring structure in accordance with aspects of the invention and FIG. 6 shows a top view of the ring structure of FIG. 5. A shown in these figures, the structure 11 is an ESD N+/P+ body diode structure. In embodiments, the structure 11 includes, for example, a BOX layer 14 formed on a substrate 12. An N+ diffusion 16 and a P+ diffusion 18 are formed in a closed or ring shape on the BOX layer 14 using conventional processes and dopants as discussed above. In embodiments, the N+ diffusion 16 is the outer structure and the P+ diffusion 18 is in the inner structure. In this embodiment, the N+ diffusion 16 and the P+ diffusion 18 are formed in electrical contact, with the N+ diffusion 16 as a cathode and the P+ diffusion 18 as an anode. In embodiments, the ESD diode will be formed between the N+ diffusion 16 and the P+ diffusion.

In embodiments, contacts 16a and 18a are formed in electrical contact with the N+ diffusion 16 and P+ diffusion 18, respectively. The contacts 16a and 18a can be formed, for example, using a conventional in-sitsu doped poly deposition process as discussed above. As should be understood, the contacts 16a and 18a are used for supplying an electrical pulse to generate heat across an active region. More specifically, the contact 18a will allow an electric pulse to flow through the anode (P+ diffusion 18) of the structure 10; whereas, the contact 16a will allow the electric pulse to flow out of the cathode (N+ diffusion 16). In an optional step, a metal deposition process (removable) can be performed on the structure. As should now be understood by those of skill in the art, the N+ diffusion 16 and the P+ diffusion 18 form an ESD N+/P+ body diode structure.

Still referring to FIGS. 5 and 6, a front end of the line (FEOL) active or passive device 20 is formed within the area formed by the rings of the N+ diffusion 16 and P+ diffusion 18, respectively. The active or passive device 20 can be formed using any conventional process for the particular device. In embodiments, the device 20 can include any desired device such as, for example, a small circuit for a phase-locked loop or phase lock loop (PLL), ring oscillator, VCO, etc. An optional block 22 may be formed on the device 20 using a conventional blocking process such as, for example, a CVD process.

FIG. 6 shows a top view of the ESD N+/P+ body diode structure 10 of FIG. 1. In embodiments, the active area 20 (e.g., active or passive device 20) is about 50 to 100 μm$^2$; however, other dimensions are also contemplated by the present invention (e.g., including larger than about 50 to 100 μm$^2$). The active area 20 is surrounded by the N+ diffusion 16 and the P+ diffusion 18 and, in this embodiment, is not part of the ESD device.

Similar to the structure of FIG. 1, in operation of the structure of FIG. 5 an electrical pulse is applied to the contact 18a which, in turn, will very quickly produce heat across the ESD N+/P+ body diode structure 10. More particularly, an electrical pulse of about 100 ns to about 500 ns can be applied across the ESD N+/P+ body diode structure 10 in order to generate a localized heat on the order of about, for example, 500° K to about 1200° K, depending on the area of the active area 20 and the duration of the electrical pulse. In embodiments, the electrical pulse is capable of generating a uniform, localized heat to a very precise location, e.g., within the active area of about 50 to 100 μm$^2$, to anneal a very small area. Also, as the heat is very localized, other regions of the substrate will not be exposed to more than a maximum allowable temperature (e.g., a temperature lower than the annealing temperature) during the entire processing of the wafer, thus ensuring that no damage will be sustained to other devices or regions of the device.

FIG. 7a shows a two-dimensional temperature profile and FIG. 7b shows a one dimensional temperature graph of the embodiment of FIG. 5. As shown in FIG. 7b, the "y" axis is temperature, in degrees Kelvin, and the "x" axis is distance across the device as measured in microns (e.g., in the "y" direction). As noted in the corresponding graphs, at a duration of about 100 nanoseconds (with a rise and fall time of about 7 nanoseconds), an electrical pulse of about 250 milliamps can apply a peak temperature of about 1200° K. The graphs further show a uniform, local temperature of about 550° K across a "y" cross section of the active area (e.g., about 8 to 10 microns). Accordingly, it is shown that an electrical pulse is capable of generating a uniform, localized heat to a very precise location, e.g., within an area of 50 to 100 μm$^2$, while not damaging other regions of the device. The plot of FIGS. 7a and 7b will be substantially the same in all cross sections of the device shown in FIGS. 5 and 6.

FIG. 8 shows a voltage vs. temperature transient simulation graph for the structure of FIG. 5. As shown in FIG. 8, the temperature rise, upon an application of an electrical pulse, is very fast. Also, as shown in the peak of the voltage line, voltage is very contained and, as such, will not cause any damage to other structures (devices) on the structure. Also, in comparison to the plot of FIG. 4, the voltage drop for the structure of FIG. 5 is smaller than that shown in FIG. 4 (for the structure of FIG. 1). This is due to the diode being smaller for the structure of FIG. 5, for example.

Figure 9:
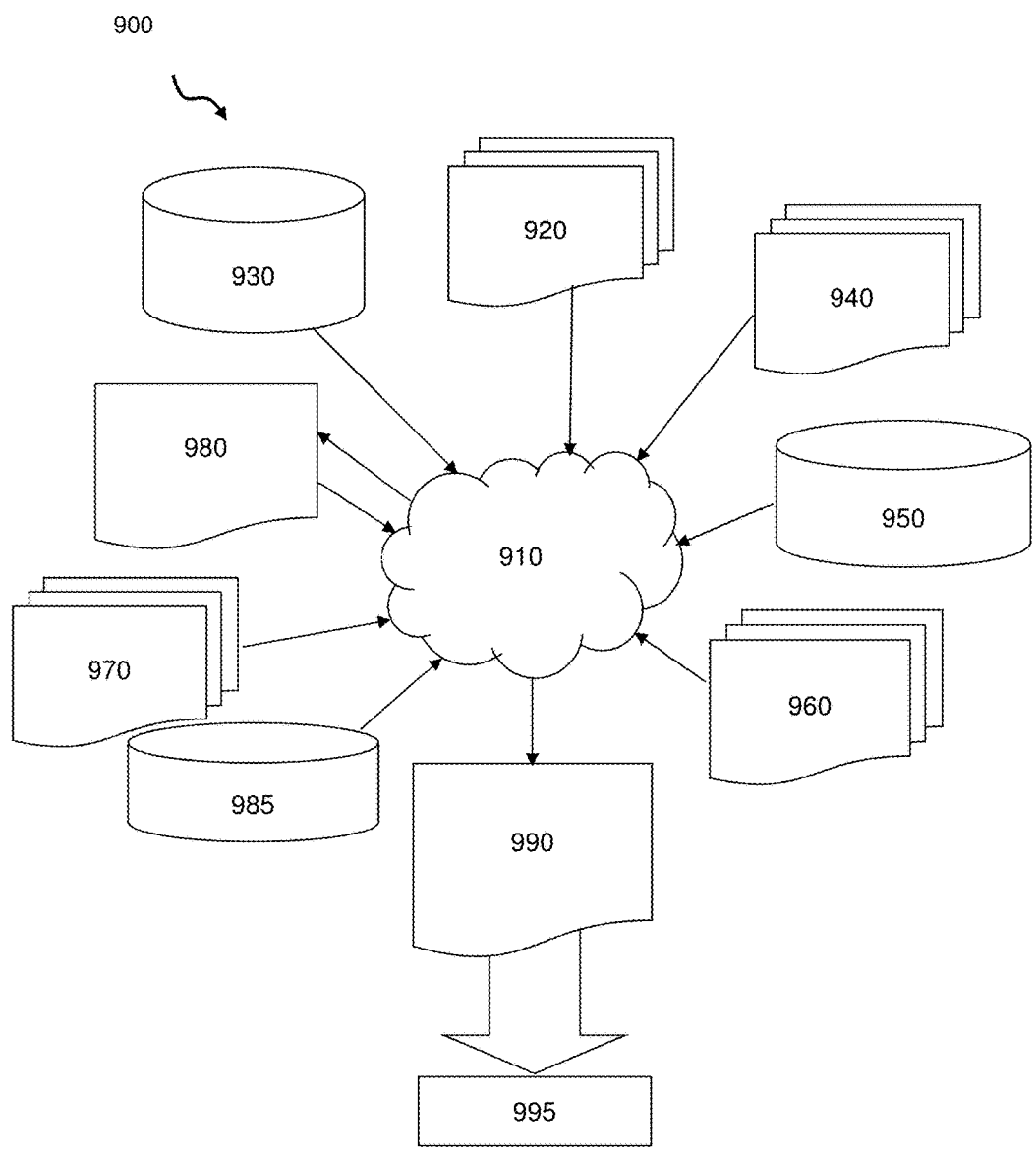
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1 and 5, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 and 5, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL (VHSIC Hardware Description Language), and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 and 5, for example, to generate a netlist 980 which may contain design structures such as design structure 920. Netlist 980 may comprise, for example, compiled or otherwise processed data structures representing a list of wires, discrete components, logic gates, control circuits, I/O (Input/Output) devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures. Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 5, for example. In one embodiment, design structure 990 may comprise a compiled, executable HDL simulation model that functionally simulates the devices shown in FIGS. 1 and 5, for example.

Design structure 990 may also employ a data format used for the exchange of layout data of integrated circuits and/or symbolic data format Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 5, for example. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. An electrostatic discharge (ESD) N+/P+ structure, comprising:
   an N+ diffusion on and in direct contact with a buried oxide (BOX) layer, wherein the BOX layer is on a substrate;
   a P+ diffusion on and in direct contact with the BOX layer and in direct electrical and physical contact with the N+ diffusion; and wherein the P+ diffusion forms an inner ring structure surrounding a device on the BOX layer, and the N+ diffusion forms an outer ring structure surrounding the P+ diffusion; and the P+ diffusion directly contacts the device.

2. The ESD N+/P+ structure of claim 1, wherein the P+ diffusion and the N+ diffusion form an ESD diode.

3. The ESD N+/P+ structure of claim 1, further comprising a first electrical contact on the P+ diffusion and a second electrical contact on the N+ diffusion to provide an electrical pulse to the P+ diffusion and allow the electrical pulse to flow out of the N+ diffusion, respectively.

4. The ESD N+/P+ structure of claim 1, wherein the device is an active device.

5. The ESD N+/P+ structure of claim 4, wherein the active device is about 50 $\mu m^2$ to 100 $\mu m^2$.

6. The ESD N+/P+ structure of claim 1, further comprising:
- a first electrical contact on the N+ diffusion; and
- a second electrical contact on the P+ diffusion,
- wherein each of the first electrical contact and the second electrical contact are located outside a perimeter of the device when the ESD N+/P+ structure is viewed from a top view.

7. The ESD N+/P+ structure of claim 6, wherein the first electrical contact and the second electrical contact are located on opposite sides of the device when the ESD N+/P+ structure is viewed from a side view.

8. The ESD N+/P+ structure of claim 7, further comprising a block on the device, the block terminating at an interface between the device and the P+ diffusion.

9. An electrostatic discharge (ESD) N+/P+ structure, comprising:
- an N+ diffusion on a buried oxide (BOX) layer, wherein the BOX layer is on a substrate;
- a P+ diffusion on the BOX layer and in direct electrical and physical contact with the N+ diffusion; and
- wherein the P+ diffusion forms an inner ring structure surrounding a device on the BOX layer, and the N+ diffusion forms an outer ring structure surrounding the P+ diffusion; and
- the P+ diffusion directly contacts the device,
- wherein the N+ diffusion is a cathode and the P+ diffusion is an anode, and each of the N+ diffusion and the P+ diffusion directly contacts the BOX layer.

10. The ESD N+/P+ structure of claim 9, wherein an ESD diode is between the N+ diffusion and the P+ diffusion.

11. The ESD N+/P+ structure of claim 10, wherein first and second electrical contacts are formed in electrical contact with the N+ diffusion and P+ diffusion, respectively.

12. An electrostatic discharge (ESD) N+/P+ structure, comprising:
- an N+ diffusion on a substrate;
- a P+ diffusion on the substrate in direct electrical and physical contact with the N+ diffusion thereby forming an ESD diode; and
- a device between the N+ diffusion and the P+ diffusion, wherein the P+ diffusion directly contacts the device, and
- wherein each of the N+ diffusion, the P+ diffusion and the device are formed on and in direct contact with a buried oxide (BOX) layer, the BOX layer being located on the substrate.

13. The ESD N+/P+ structure of claim 12, wherein both the N+ diffusion and the P+ diffusion are formed as respective ring structures surrounding the device.

14. The ESD N+/P+ structure of claim 13, wherein the N+ diffusion is formed as an outer ring and the P+ diffusion is formed as an inner ring of the respective ring structures.

15. The ESD N+/P+ structure of claim 12, further comprising:
- a first electrical contact on the N+ diffusion; and
- a second electrical contact on the P+ diffusion,
- wherein each of the first electrical contact and the second electrical contact are located outside a perimeter of the device when the ESD N+/P+ structure is viewed from a top view.

16. The ESD N+/P+ structure of claim 15, wherein the first electrical contact and the second electrical contact are located on opposite sides of the device when the ESD N+/P+ structure is viewed from a side view.

17. The ESD N+/P+ structure of claim 16, further comprising a block on the device, the block terminating at an interface between the device and the P+ diffusion.

* * * * *